United States Patent
Tetsuka et al.

(10) Patent No.: US 6,940,722 B2
(45) Date of Patent: Sep. 6, 2005

(54) HEAT-DISSIPATING MEMBER, MANUFACTURING METHOD AND INSTALLATION METHOD

(75) Inventors: Hiroaki Tetsuka, Gunma (JP); Kunihiko Mita, Gunma (JP); Kunihiro Yamada, Gunma (JP); Yoshitaka Aoki, Gunma (JP); Tsutomu Yoneyama, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 251 days.

(21) Appl. No.: 10/347,599

(22) Filed: Jan. 22, 2003

(65) Prior Publication Data

US 2003/0151898 A1 Aug. 14, 2003

(30) Foreign Application Priority Data

Jan. 22, 2002 (JP) ..................................... 2002-012430
Jul. 3, 2002 (JP) ..................................... 2002-194200

(51) Int. Cl.[7] ............................................... H05K 7/20
(52) U.S. Cl. ....................... 361/708; 361/709; 428/447; 428/450
(58) Field of Search ............................... 428/447, 450; 361/708, 709; 524/408, 409, 403, 437, 440, 441

(56) References Cited

U.S. PATENT DOCUMENTS 6,620,515 B2 * 9/2003 Feng et al. ................. 428/447
6,761,928 B2 * 7/2004 Hill et al. ................... 427/123
6,791,839 B2 * 9/2004 Bhagwagar ................. 361/705

* cited by examiner

*Primary Examiner*—Randy Gulakowski
*Assistant Examiner*—Christopher Keehan
(74) *Attorney, Agent, or Firm*—Millen White Zelano & Branigan P.C.

(57) ABSTRACT

A heat-dissipating member sandwiched between a heat dissipating electronic component which reaches a higher temperature than room temperature due to operation, and a heat-dissipating component for dissipating the heat produced from this heat dissipating electronic component. The heat-dissipating member of this invention has an interlayer comprising a metal foil and/or metal mesh having a thickness of 1–50 $\mu$m and heat conductivity of 10–500 W/mK, and a layer comprising a thermally-conducting composition containing 100 wt parts of a silicone resin and 1,000–3,000 wt parts of a thermally-conducting filler formed on both surfaces of the interlayer such that the overall thickness is within the range of 40–500 $\mu$m. This heat-dissipating member is non-fluid at room temperature, but due to the action of heat emitted when the electronic component operates, its viscosity decreases, and it softens or melts based on the phase transition of the resin and low melting point metal so that it is effectively in intimate contact with the boundary between the electronic component and heat-dissipating component without any gaps. The thermally-conducting filler contains a low melting point metal powder (1) having a melting temperature of 40–250° C. and a particle diameter of 0.1–100 $\mu$m, together with a thermally-conducting powder (2) having a melting temperature exceeding 250° C. and an average particle diameter of 0.1–100 $\mu$m, such that $(1)/[(1)+(2)]=0.2–1.0$.

15 Claims, 1 Drawing Sheet

Prior to heat shock test        After heat shock test

HEAT-DISSIPATING MEMBER, MANUFACTURING METHOD AND INSTALLATION METHOD

FIELD OF THE INVENTION

This invention relates to a heat-dissipating member used to cool a heat dissipating electronic component, comprising a silicone resin and a thermally-conducting filler, the shape of the heat-dissipating member reversibly changing from a solid to a paste or liquid when the temperature of the electronic component rises, and which has excellent thermally-conducting properties suitable for dissipating the heat from an IC package.

BACKGROUND OF THE INVENTION

The circuit design of electronic components used in TVs, radios, computers, medical devices, office machinery and communications apparatus is becoming increasingly complex. For example, with the manufacture of these devices and integrated circuits equivalent to hundreds of thousands of transistors for other devices, designs are becoming more complex, while at the same time electronic components are becoming smaller, even larger numbers of components are being built into ever smaller surface areas, and devices are continually becoming more compact.

These electronic components, in particular IC packages such as CPUs mounted on printed circuit boards, suffer decreased performance due to the temperature rise accompanying the heat emitted during use, and this leads to defects and loss of function. To solve this problem, in the related art, a heat dissipating sheet or heat dissipating grease with good heat conduction properties was interposed between the IC package and a heat-radiating fin. However, as components continue to become more compact and their performance improves, their heat emission amount is increasing year by year, so a heat-dissipating member having excellent heat-dissipating properties was desired.

In particular, in recent years, the CPUs used in electronic instrument such as personal computers, digital video disks and portable telephones, or the LSIs in driver IC or memories, are becoming more highly integrated and their operation is becoming faster, so their power consumption is increasing. This increased heat emission is one reason for faulty operation of electronic equipment or damage to electronic components, so an efficient way of dealing with heat emission is an important issue.

In the related art, in electronic equipment, a heat sink using a metal plate having a high thermal conductivity such as yellow copper or the like, was used to suppress the temperature rise of electronic components during use. This heat sink conducts heat produced by the electronic components, and discharges it to the surface due to the temperature difference with the outside air.

In order for a heat sink to efficiently conduct heat produced by an electronic component, the heat sink must be in intimate contact with the electronic component. However, there is a difference in height of various components and a tolerance in assembly procedures, so a flexible thermally-conducting sheet or thermally-conducting grease was interposed between the electronic component and the heat sink, and heat from the electronic component was conducted to the heat sink via this thermally conducting sheet or thermally conducting grease.

The heat-dissipating sheet of the related art has the advantage it can be easily mounted, but from the viewpoint of workability in the manufacturing process, there is a limit to the thermally-conducting filler it can contain, and as there was a high boundary thermal resistance when it was installed, it did not exhibit its full heat-dissipating properties in practice.

The aforesaid thermally-conducting sheet was a thermally-conducting sheet formed, for example, from a thermally-conducting silicone rubber (thermally-conducting silicone rubber sheet) and the thermally-conducting grease was a thermally-conducting silicone grease. However, with the thermally-conducting silicone rubber sheet used in the related art, gaps are produced in the interface with the electronic component, so boundary contact resistance increased and thermally-conducting properties were inadequate. This defect is a major problem for cooling a high frequency-driven CPU which has a large heat emission, so the reduction of boundary contact resistance was strongly desired.

Termally-conducting grease on the other hand, is close to a liquid, and its boundary contact resistance can practically be ignored, in addition to which it has good thermally-conducting properties. However, a special dispenser must be installed, and it is not easy to recover it. Further, if the thermally-conducting grease is subjected to heat cycles between room temperature and the operating temperature of the electronic component (60–120° C.) for long periods of time, a problem of pump-out arises. In pump-out, liquid oil ingredients contained in the grease separate and ooze out from between the electronic component and heat-dissipating member, so the grease solidifies, and cracks or voids appear in it. As a result, the thermal resistance increases, and the heat from the electronic component can no longer be dissipated. Therefore, although heat-dissipating grease has the advantages that it can follow and be in contact with coated surfaces without being affected by imperfections in the surface of the CPU or heat-dissipating fin, and its boundary thermal resistance is low, it soils other components, and the oil in it oozes out after long periods of use.

To resolve the above problems, a phase-change heat-dissipating member (phase change sheet), which is a solid sheet at room temperature, but which softens due to the heat released during operation of electronic components so that its boundary contact resistance reaches a negligible level, has already been proposed. For example, U.S. Pat. No. 4,466,483 discloses a phase-changing wax layer formed on both surfaces of a non-metal sheet, and U.S. Pat. No. 5,904,796 discloses a phase-changing paraffin or petroleum jelly formed on one surface of a metal foil and a layer formed on the other surface. Further, JP-A No. 2000-509209 (Koho) discloses a phase change sheet comprising an acrylic binder, wax and thermally-conducting filler, wherein an interlayer comprising a reticular structure or film is not provided.

However, in the aforesaid related art, from the viewpoint of ease of processing and operation, there was a limit to the thermally-conducting filler material amount. Also, even after a phase transition, the contact surfaces are in intimate contact with just resin ingredients as the main body. Therefore, although increase of boundary contact resistance could be prevented, as the heat conductivity of the resin itself is low, the demand for further reduction of boundary contact resistance could not be satisfied.

The Inventor carried out intensive studies to solve the above problems. A heat-dissipating member having excellent heat-dissipating properties was thereby discovered which is a solid at ordinary temperature, can assume any required shape including that of a sheet, and by allowing a complete phase transition of the thermally-conducting filler in the uncured ingredients, permits a remarkable reduction of boundary contact resistance. It was also discovered that when this composition is manufactured, it has excellent homogeneity, and can easily be molded into any desired shape including that of a sheet by using a low melting point metal powder of controlled particle diameter, and blending/kneading this under temperature conditions below its melting point.

Specifically, a composition obtained by selecting a silicone resin which is a solid at ordinary temperature, which softens within a fixed temperature range and which has a low viscosity or melts, and if necessary uses a thermally-conducting powder having a melting point of 250° C. or higher as filler, is disposed between a heat dissipating electronic component and heat-dissipating component (boundary), and attains the desired heat dissipation by causing a phase transition in the low melting point metal rather than the resin.

In particular, in the case of a heat-dissipating member which is a solid sheet at ordinary temperature containing a low melting point metal which can easily be attached to or removed from an electronic component or heat sink, the boundary contact resistance was reduced to a negligible level, and excellent heat-dissipating performance was obtained over long periods of time without pump-out. This is due to melt softening of the low melting point metal rather than the resin by the heat emitted during operation of the electronic component, or by temporarily applying heat above the melting point of the low melting point metal contained in the composition during installation, and this led to the present invention.

It is therefore a first object of this invention to provide a heat-dissipating member having heat-dissipating properties superior to those of the heat-softening heat-dissipating members of the related art, which uses a phase transition of a low melting point metal.

It is a second object of this invention to provide a heat-dissipating member which is a sheet or film at ordinary temperature, which has a sufficiently small boundary contact resistance in use, and which has excellent heat dissipation properties over long periods of time without pump-out.

It is a third object of this invention to provide a method of manufacturing a heat-dissipating member having heat-dissipating properties superior to those of the heat-softening heat dissipating members of the related art, using a phase transition of a low melting point metal.

It is a fourth object of this invention to provide a method of manufacturing a heat-dissipating member which is a sheet or film at ordinary temperature, and which is reversibly melt softened by the action of heat in use.

It is a fifth object of this invention to provide an installation method which makes full use of the performance of the heat-dissipating member of this invention.

SUMMARY OF THE INVENTION

The above objects of this invention are attained by a heat dissipating member installed (at the boundary) between a heat dissipating electronic component which reaches a higher temperature than room temperature due to its operation, and a heat-dissipating component which dissipates the heat produced by the heat dissipating electronic component, wherein this heat-dissipating member is a thermally-conducting silicone resin composition comprising 100 wt parts of a silicone resin and 1,000–3,000 wt parts of a thermally-conducting filler, the member is non-fluid at room temperature prior to the operation of the electronic component, but due to the emission of heat when the electronic component operates, the member loses its viscosity, softens or melts so as to effectively fill the gap between the electronic component and the heat-dissipating component, the thermally-conducting filler comprising a low melting point metal powder (1) having a melting temperature of 40–250° C. and a particle diameter of 0.1–100 μm, together with a thermally-conducting powder (2) having a melting temperature exceeding 250° C. and an average particle diameter of 0.1–100 μm, the filler being used such that (1)/[(1)+(2)]=0.2–1.0.

In particular, if the heat-dissipating member has an interlayer comprising a metal foil and/or metal mesh having a thickness of 1–50 μm and heat conductivity of 10–500W/mK, and a layer comprising a thermally-conducting composition containing 100 wt parts of a silicone resin and 1,000–3,000 wt parts of a thermally-conducting filler, is formed on both surfaces of the interlayer such that the overall thickness is within the range of 40–500 μm, the strength is increased and the member is easier to use.

DETAILED DESCRIPTION OF THE INVENTION

The silicone resin which can be used as the medium (matrix) of the heat-dissipating member of this invention is such that the heat-dissipating member is effectively a solid (non-fluid) at ordinary temperature, and softens, assumes lower viscosity or melts so that it fluidizes at a fixed temperature, preferably 40° C. or above, but below the maximum temperature reached due to the heat emitted by the heat dissipating electronic component, specifically within a temperature range of the order of 40–150° C. but more particularly 40–120° C. This medium is one factor which causes the softening, and it also functions as a binder which confers workability and ease of manipulation on the thermally-conducting filler which confers heat conductivity.

Herein, the softening, low viscosity or melting temperature is that of the heat-dissipating member, and the silicone resin itself may have a melting point of less than 40° C. The medium which causes softening may be selected from among any silicone resins as described above, but to maintain non-fluidity at ordinary temperature, polymers containing R—$SiO_{3/2}$ units (hereafter referred to as T units) and/or $SiO_2$ units (hereafter referred to as to Q units), and copolymers of these with $R_2SiO_{2/2}$ units (hereafter referred to as D units) may for example be used. Silicone oil or silicone natural rubber comprising D units may also be added. Of these, combinations of silicone resins comprising T units and silicone oil or silicone natural rubber having a viscosity at 25° C. of 100 Pa/s or higher, are preferred. The end of the silicone resin may also be terminated by a $R_3SiO_{1/2}$ unit (M unit).

Herein, the aforesaid R is an unsubstituted or substituted hydrocarbon group having 1–10, but preferably 1–6, carbon atoms. Specific examples of R are alkyl groups such as methyl, ethyl, propyl, isopropyl, butyl, isobutyl, tert-butyl, heptyl, neopentyl, hexyl, cyclohexyl, octyl, nonyl and decyl; aryl groups such as phenyl, tolyl, xylyl and naphthyl; alkenyl groups such as benzyl, phenylethyl and phenylpropyl; alkenyl groups such as vinyl, allyl, propenyl, isopropenyl, butenyl, hexenyl, cyclohexenyl and octenyl, and part or all of the hydrogen atoms in these groups may be substituted by for example chloromethyl, chloropropyl, bromoethyl, trifluoropropyl or cyanoethyl. Of these, methyl, phenyl and vinyl are preferred.

Describing the silicone resin in more detail, the silicone resin used in this invention comprises T units and/or Q units, and is designed with M units and T units, or M units and Q units. To obtain a substance having excellent toughness during solidification (and make it less brittle to prevent damage in handling), it is effective to introduce T units, and preferable to use D units. Here, the substituent groups (R) in the T units are preferably methyl and phenyl, and the substituent groups in the D units are preferably methyl, phenyl and vinyl. The proportion of T units to D units is preferably 10:90–90:10, but more preferably 20:80–80:20.

Even in the case of the resin synthesized from M units and T units, or M units and Q units which is normally used, brittleness can be reduced by including T units, and mixing this with a high viscosity oil (100 Pa/s or higher) or rubber compound comprising mainly D units (terminated by an M unit). This also prevents pumping-out (bubbles due to separation of filler and base siloxane, or outflow of base siloxane) when a heat shock is applied.

Consequently, due to the above reasons, if a silicone resin having a softening, point comprises T units but not D units, a material having excellent handling properties can be obtained by adding a high viscosity oil or natural rubber having D units as the principal ingredient. In this case, the addition amount of the high viscosity oil or natural rubber compound having D units as the principal ingredient, is preferably 1–100 wt parts, but more preferably 2–10 wt parts, relative to 100 wt parts of the silicone resin having a softening point or melting point higher than room temperature. If it is less than 1 weight part, there is a high possibility that pumping-out will occur, and if it exceeds 100 wt parts, there is a risk that heat-dissipating performance will be insufficient.

As described above, the viscosity of the silicone resin can be reduced, it being sufficient if it can act as the binder for the filler. The molecular weight of this lower melting point silicone resin is preferably 500–20,000, but more preferably 1,000–10,000.

It is convenient if the silicone resin used in this invention confers flexibility and tackiness on the heat-dissipating member of this invention. In this case, a polymer having a single viscosity can be used, but if two or more polymers of different viscosities are mixed together, a sheet having an excellent balance can be obtained, so two or more polymers of different viscosities can be used.

The heat-dissipating member of this invention is preferably cross-linked after first heat softening, reducing the viscosity or melting, as this improves reworking properties. Specifically, by first heat softening, this composition adheres closely to the heat dissipating electronic component and heat-dissipating component. Due to subsequent crosslinking, it closely follows the surface with which it is in intimate contact while maintaining a low thermal resistance, and as it is cross-linked, it can easily be peeled off when reworking is required. Also, due to the crosslinking, its shape can be maintained even when it exceeds the softening point of the related art, and it acts as a heat-dissipating member even at high temperature.

Due to these reasons, this composition preferably has curing properties due to crosslinking reactions. To satisfy this purpose, the aforesaid polymer preferably has curing functional groups at the end or in the side chain. Common examples of these functional groups are aliphatic unsaturated groups, silanol groups and alkoxysilyl groups.

The thermally-conducting filler used in this invention comprises an ingredient (1) and an ingredient (2). The ingredient (1) melts and comes in intimate contact with the surface of the heat dissipating component and heat-dissipating component without being affected by imperfections, and effectively without a phase transition of the heat-dissipating member, and due to the considerable degrees of boundary resistance, and by joining with other fillers or with itself, exhibits high heat dissipation properties. The ingredient (2) is simply added to confer thermally-conducting properties without phase transition.

Normally, ingredient (1) is referred to as a low melting point metal, and in this invention, it is used as an atomized powder. If the melting point of this lower melting point metal powder is less than 40° C., handling is difficult, and if it is higher than 250° C., it may damage the heat dissipating component and heat-dissipating component which are installed. Therefore, it must lie within a range of 40–250° C., but preferably 100–220° C. If the average particle diameter of the low melting point metal powder is less than 0.1 $\mu$m, viscosity of the composition obtained is too high, extrusion properties are poor and it is difficult to form a sheet or film. If the average particle size exceeds 100 $\mu$m, the composition obtained is non-homogeneous, and the surface may become rough when the sheet or film is formed. Therefore, its average particle diameter must lie within a range of 0.1–100 $\mu$m, but preferably 20–250 $\mu$m. The shape of the particles may be spherical or irregular.

The low melting point metal powder of ingredient (1) may be a single metal such as indium or tin, or it may be an alloy of several metals. Examples of this alloy are malotte alloys comprising bismuth, lead, tin or antimony, cerromatrix alloys, solder comprising tin, lead, bismuth, indium, cadmium, zinc, silver or antimony, Wood's metal, cerrotrue alloys, and aluminum solder comprising aluminum, zinc, tin, lead or cadmium ("Handbook of Basic Chemistry", 4th Edition: Chemical Institute of Japan, 30 Sep., 1993, pi-547).

If the average particle diameter of ingredient (2) is less than 0.1 μm, the viscosity of the composition obtained is too high and extrusion properties are poor, so it is difficult to form the heat-dissipating member into a sheet or film. If the average particle diameter exceeds 100 μm, the composition obtained is non-homogeneous, its surface is rough when it is attempted to form it into a sheet or film, and as the gap between the electronic component and heat-dissipating component becomes larger, sufficient heat-dissipating performance may not be obtained. Therefore, its average particle diameter must be within the range 0.1–100 μm, but preferably 20–50 μm.

The thermally-conducting filler of ingredient (2) is simply intended to confer thermally-conducting properties without phase transition. Its average particle diameter must lie within the range 0.1–100 μm, but preferably 20–50 μm. There is no particular limitation on the thermally-conducting powder of ingredient (2) provided that its thermal conductivity is good and its melting point exceeds 250° C. Examples are aluminum powder, zinc oxide powder, alumina powder, boron nitride powder, aluminum nitride powder, silicon nitride powder, copper powder, silver powder, diamond powder, nickel powder, zinc powder, stainless steel powder and carbon powder, but the invention is not limited thereto. The particles thereof may be spherical or irregular in shape, these being used alone, or two or more being used in conjunction.

The total weight of the ingredients (1) and (2) is 1,000–3,000 wt parts relative to 100 wt parts of silicone resin, and the ingredients (1) and (2) are blended so that (1)/[(1)+(2)]= 0.2–1.0. If the total weight of the ingredients (1) and (2) is less than 1,000 wt parts, the thermally conducting properties of the composition obtained are poor, and if it is larger than 3,000 wt parts, manipulation is difficult. According to this invention, it is particularly preferred that it is 1,500–2,500 wt parts. Also, if (1)/[(1)+(2)] is less than 0.2, not much improvement of heat-dissipating properties can be expected.

According to this invention, the ingredient (1) is indispensable, but the ingredient (2) is not indispensable. However, if the ingredient (2) is also used in conjunction, heat-dissipating performance, sheet workability and ease of manipulation are improved.

In the heat-dissipating member of this invention, it is also effective to add a flux ingredient to remove the oxide film on the surface of the thermally-conducting filler and improve filler properties. The flux ingredient is first coated on a metal foil or metal mesh which functions as an interlayer described later, and a layer of the thermally conducting composition is then formed on both surfaces. Subsequently, the flux ingredient can be coated on the thermally-conducting composition layer surface so as to improve the intimate contact properties of the interlayer and composition layer, or electronic component and composition layer surface (heat-dissipating member surface). Flux ingredients may be broadly divided into inorganic, organic and resin types.

Examples of the inorganic type are inorganic acids such as normal phosphoric acid, hydrochloric acid, hydrobromic acid and hydrofluoric acid, zinc chloride, stannous chloride, ammonium chloride, ammonium fluoride, sodium fluoride and inorganic acid such as zinc chloride/ammonium fluoride=75/25. Examples of the organic type are organic acids such as formic acid, acetic acid, oleic acid, stearic acid, adipic acid, lactic acid, glutamic acid, organic acid salts such as ammonium formate and methylamine lactate, amines such as ethylene diamine; and amino hydrohalides such as methylamine hydrochloride, butylamine hydrobromide, ethylene diamine hydrochloride, triethanolamine hydrochloride and aniline chloride.

Examples of resins are rosin and active rosin. In particular, the composition of this invention may also contain an organic acid type or resin type flux which is not only easy to blend and knead, but which also dissolves in a solvent and is easy to coat on the sheet which is formed. If the blending amount of this flux is less than 0.05 wt parts relative to 100 wt parts of silicone resin, there is little effect, whereas even if it is more than 40 wt parts, there is no increase of effect, therefore it is preferably within the range of 0.05–40 wt parts but more preferably 0.1–30 wt parts.

The heat-dissipating member of this invention may also contain additives or fillers normally used in synthetic rubber as arbitrary ingredients to the extent that they do not interfere with the purpose of this invention. Specific examples of these additives are silicone oil as a mold releasing agent; fluorine-modified silicone surfactants; carbon black, titanium dioxide and red ocher as colorants; a platinum catalyst as a flame retardant; metal oxides such as iron oxide, titanium oxide and cerium oxide, or metal hydroxides; process oils, reactive silanes or siloxanes as process enhancing agents; and catalysts such as reactive titanate catalysts or reactive aluminum catalysts. Further, microfine powders such as sedimenting or sintered silicone as an anti-sedimentation agent when the thermally-conducting filler is at high temperature, or a thixotropic property enhancing agent, may be added as desired.

The heat-dissipating member of this invention may easily be manufactured by blending and kneading the aforesaid ingredients at a temperature below the melting point of the low melting point metal powder, using a rubber kneading machine such as a dough mixer (kneader), gate mixer or planetary mixer. If it is blended and kneaded at a temperature above the melting point of the low melting point metal, it becomes non-homogeneous and the particle diameter of the low melting point metal powder after kneading increases, so the composition obtained becomes non-homogeneous and the surface of the sheet or film which is formed becomes rougher, which is undesirable.

The heat-dissipating member of this invention is normally used in the form of a sheet or film. This sheet or film may be formed by extrusion molding the heat-dissipating member after kneading, calender molding, roller molding, press molding, or molding by coating, etc., after dissolving in a solvent. There is no particular limitation on the thickness of the sheet or film, but it is preferably 0.02–2 mm, more preferably 0.03–1 mm and still more preferably 0.1–0.4 mm. Further, a mold releasing sheet can be affixed before use.

Whatever the form, i.e. sheet or film, the thermal conductivity of the heat-dissipating member of this invention is preferably 0.5W/mK or more. If the heat conductivity is less than 0.5W/mK, heat conduction from the electronic component to the heat-dissipating component is poorer, and sufficient heat-dissipating performance may not be obtained.

Also, from the viewpoint of filling the space between the electronic component and heat-dissipating component, the viscosity of the heat-dissipating member of this invention at 80° C. is preferably within the range of $1 \times 10^2 – 1 \times 10^5$ Pa/s but more preferably within the range of $5 \times 10^2 – 5 \times 10^4$ Pa/s regardless of whether or not the the low melting point metal is in a molten state. If the viscosity is less than $1 \times 10^2$ Pa/s, the member may flow out from between the space between the electronic component and heat-dissipating component such as a heat sink, while if it exceeds $1 \times 10^5$ Pa/s, the gap between the electronic component and heat-dissipating component does not decrease and sufficient heat-dissipating performance may no longer be obtained.

The metal foil and/or metal mesh used as interlayer in this invention has the function of a support in enhancing the strength of the sheet or film heat-dissipating member. Specifically, it improves ease of handling when the heat-dissipating member of this invention is fitted to or removed from an electronic component or heat-dispersing member such as a heat sink at room temperature. The metal foil and metal mesh are preferably metals having a high thermal conductivity of 10–500W/mK. Specific examples of these metals are aluminum alloy, magnesium alloy, copper, iron, stainless steel, silver and gold. The metal mesh is a metal foil having plural hole openings formed by stamping, or the aforesaid metal wire is made into a weave. The thickness of the metal foil and metal mesh must be within the range of 1–50 μm. If it is less than 1 μm, it cannot increase the strength of the heat-dissipating member as a support, and if it exceeds 50 μm, the flexibility of the heat;-dissipating member decreases, and air tends to be sucked into the gap between the electronic component or heat sink and heat-dissipating member during installation.

The metal foil or metal mesh also has the function of suppressing pump-out of the thermally-conducting composition. In general, a heat-dissipating sheet is assembled so that it can receive compressive stress from the electronic component and heat-dispersing member. The resin ingredients and low melting point metal of this invention soften or melt under the action of heat, and in this process, the thermally-conducting composition oozes out from the contact surfaces of the electronic component and heat-dispersing member due to compressive stress so that the thickness decreases, however a frictional force acts between the interlayer and thermally-conducting composition, so this bleeding can be suppressed compared to the case where there is no interlayer. Further, bleeding (pump-out) of liquid ingredients is also suppressed by frictional force in the same way. If the interlayer is a metal mesh, the thermally-conducting composition is buried in the openings of the mesh, and pump-out can be more effectively suppressed.

The overall thickness of the heat-dissipating member of this invention when an interlayer is provided is preferably within the range of 40–500 μm. It is less than 40 μm, rigidity is insufficient and the heat-dissipating member deforms when it is handled during operations, whereas if it exceeds 500 μm, the thermal resistance increases which is undesirable.

As described above, the heat conductivity of the thermally-conducting composition of this invention is preferably 0.5W/mK or more, and its viscosity at 80° C. is preferably within the range of $1 \times 10^2 – 1 \times 10^5$ Pa/s whether or not it comprises a low melting point metal powder in the molten state. If the thermal conductivity is less than 0.5W/mK, thermally-conducting properties between the electronic component and heat sink declines and sufficient heat-dissipating performance is not obtained, and it is particularly preferred that it is 1.0W/mK or more.

If the viscosity at 80° C. is less than $1 \times 10^2$ Pa/s, liquid ingredients may pump out from between the electronic component and heat sink, whereas if it is more than $1 \times 10^5$ Pa/s, it is disadvantageous from the viewpoint of processability, the gap between the electronic component and heat sink does not become thin and thermally-conducting properties decrease, so sufficient heat-dissipating performance is not obtained.

As described above, the heat-dissipating member may be formed only of the ingredient (1) without using the ingredient (2), but by using the ingredient (1) and the ingredient (2) in conjunction, the heat dissipating performance of the heat-dissipating member, sheet processability and ease of operation are further enhanced.

The heat-dissipating member of this invention comprising an interlayer may be obtained by forming the aforesaid thermally-conducting composition with metal foil or metal mesh into a composite sheet by extrunding, press or coating method. In the case of coating method, the thermally-conducting composition is preferably heat melted or dissolved in a solvent to give a coating solution. Examples of this solvent are toluene, xylene, thinner or Mineral spirit. The heat melting process is performed at a temperature below the melting point of the low melting point metal powder, as in the case of blending and kneading.

When the heat-dissipating member of this invention is installed between a heat dissipating component and a heat-dissipating component which dissipates the heat produced from the heat dissipating component, it is preferably temporarily heated to a temperature above the melting point of the low melting point metal powder contained in the heat-dissipating member of this invention. In this way, the heat-dissipating member of this invention softens due to the action of heat and comes in intimate contact with both the heat dissipating component and heat-dissipating component, so its heat-dispersing efficiency is fully utilized. Further, if it is cross-linked by this temporary heating, it can easily be peeled off when reworking is required.

The heat-dispersing member of this invention has good thermally conducting properties, and good contact with a heat dissipating electronic component and heat-dissipating component, so by interposing it between these two types of components, heat produced by the heat dissipating electronic component is efficiently dispersed. This largely improves the lifetime of heat dissipating electronic components, and devices using these components.

EXAMPLES

This invention will now be described in further detail referring to specific examples, but it is not be construed as being limited in any way thereby.

The heat-dissipating member of this invention comprises the following ingredients.

Silicone Resin:
Silicone resin: $D_{25}T^{\square\Phi}{}_5 D^{Vi}{}_{20}$ (softening point: 30–50° C.), figures are mole %, where, D is $Me_2SiO_{2/2}$, $T^\Phi$ is $PhSiO_{3/2}$, $D^{Vi}$ is $ViMeSiO_{2/2}$, Me is methyl, Ph is phenyl, Vi is vinyl, respectively. The ratios of D, $T^\Phi$, $D^{Vi}$ are mole %.

Thermal-Conducting Filler:
Component (1): Low Melting Point Metal Powder
  1-1: Indium powder [melting point 156.7° C.] of average particle diameter 18.4 μm
  1-2: Indium powder [melting point of 156.7° C.] of average particle diameter 47.6 μm
  1-3: Powdered alloy [melting point 139° C.] of tin (42 wt %)/bismuth (58 wt %) of average particle diameter 26.9 μm
  1-4: Indium powder [156.7° C.] of average particle diameter 110 μm Component (2): Metal Filler
  2-1: Aluminum powder of average particle diameter 7.4 μm
  2-2: Zinc oxide powder of average particle diameter 11.0 μm
  2-3: Nickel powder of average particle diameter 10.0 μm
  2-4: Aluminum powder of average particle diameter 120 μm Flux: rosin powder Examples 1–6

The above ingredients were introduced into a planetary mixer to give the composition shown in Table 1, and mixed with stirring at 70° C. (below the melting point of Component (1)) for 1 hour. Next, the compound obtained was coated to form a heat-softened sheet of predetermined shape.

The surface state when the sheet was formed was evaluated from the arithmetical average roughness (cutoff value: λc=8 mm), using a surface roughness gauge (Mitsutoyo Ltd., Model No: Sufect-501).

Next, the heat-softened sheet was sandwiched between two standard aluminum plates, and heated at 170° C. for 15 minutes while applying a pressure of approximately 1.80 kg/cm². After preparing a thermal resistance measurement sample as described above, the thickness was measured for each of the two standard plates, and the effective sheet thickness was measured by subtracting the thickness of the standard aluminum plates from the total thickness. The above measurement was performed using a micrometer (Mitsutoyo, Model No: M820-25VA). Also, the thermal resistance of the final cured product was measured using a thermal resistance measuring apparatus (Horometrics: Microflash). These measurement results are shown in Table 1.

TABLE 1

Units: wt parts

| | Examples | | | | | |
|---|---|---|---|---|---|---|
| | 1 | 2 | 3 | 4 | 5 | 6 |
| Silicone resin: D25TΦ55DVi20 | 100 | 100 | 100 | 100 | 100 | 100 |
| Thermally-conducting filler | | | | | | |
| 1-1 | 1200 | 0 | 0 | 1300 | 1000 | |
| 1-2 | 0 | 1200 | 0 | 500 | 0 | |
| 1-3 | 0 | 0 | 1200 | 0 | 0 | 1500 |
| 1-4 | 0 | 0 | 0 | 0 | 0 | 0 |
| 2-1 | 400 | 400 | 400 | 0 | | |
| 2-2 | 100 | 100 | 100 | 0 | 200 | |
| 2-3 | 0 | 0 | 0 | 0 | 800 | 500 |
| 2-4 | 0 | 0 | 0 | 0 | 0 | 0 |
| Flux: rosin powder | 0 | 0 | | 0 | 0 | 0 |
| (1)/[(1) + (2)] | 0.706 | 0.706 | 0.706 | 1.0 | 0.5 | 0.75 |
| Surface state when sheet is formed Arithmetical average roughness: Ra(μm) | 2.6 | 2.9 | 2.7 | 3.0 | 3.2 | 3.2 |
| Thermal resistance (mm²-K/W) | 4.3 | 5.2 | 5.4 | 4.0 | 6.2 | 6.5 |
| Thickness (μm) | 25 | 35 | 30 | 30 | 35 | 38 |

Comparative Examples 1–5

A cured product was obtained in an identical way to that of Examples 1–6, using the ingredients in the following Table 2 instead of the ingredients in Table 1. The results of measurements performed on the cured product obtained in an identical manner to those of Examples 1–6, are shown in Table 2.

TABLE 2

Units: wt parts

| | Comparative Examples | | | | |
|---|---|---|---|---|---|
| | 1 | 2 | 3 | 4 | 5 |
| Silicone resin: D25TΦ55DVi20 | 100 | 100 | 100 | 100 | 100 |
| Thermally-conducting filler | | | | | |
| 1-1 | 600 | 0 | 1600 | 0 | 1200 |
| 1-2 | 0 | 0 | 0 | 0 | 0 |
| 1-3 | 0 | 300 | 0 | 0 | 0 |
| 1-4 | 0 | 0 | 0 | 1200 | 0 |
| 2-1 | 200 | 1000 | 1200 | 400 | |
| 2-2 | 100 | 300 | 400 | 0 | 100 |
| 2-3 | 0 | 0 | 0 | 200 | 0 |
| 2-4 | 0 | 0 | 0 | 0 | 400 |
| Flux: rosin powder | 0 | 0 | 1.0 | 0 | 0 |
| (1)/[(1) + (2)] | 0.75 | 0.19 | Very brittle, very low self-support | 0.7 | 0.706 |
| Surface state when sheet is formed Arithmetical average roughness: Ra($\mu$m) | 2.4 | 2.9 | | 8.6 | 7.1 |
| Thermal resistance (mm$^2$-K/W) | 15.3 | 16.7 | | 5.2~8.8a) | 39.5 |
| Thickness ($\mu$m) | 35 | 45 | | 35a) | 95 |

The results of Table 1, Table 2 show the efficacy of the heat-dissipating member of this invention.

Examples 7–12 and Comparative Examples 6–10

Interlayer: Aluminum Foil 50 $\mu$m

Silicone resin: Silicone resin represented by $D_2T^\Phi{}_{55}D^{Vi}{}_{20}$ having a softening point of 30–50° C., where, D is $Me_2SiO_{2/2}$, $T^\Phi$ is $PhSiO_{3/2}$, $D^{Vi}$ is $ViMeSiO_{2/2}$, Me is methyl, Ph is phenyl, Vi is vinyl, respectively. The ratios of D, $T^\Phi$, $D^{Vi}$ are mole %.

Heat-Conducting Filler

Component (1): Low Melting Point Metal Powder 1-1: Indium powder [melting point 156.7° C.] of average particle diameter 18.4 $\mu$m 1-2: Indium powder [melting point of 156.7° C.] of average particle diameter 47.6 $\mu$m 1-3: Powdered alloy [melting point 139° C.] of tin (42 wt %)/bismuth (58 wt %) of average particle diameter 26.9 $\mu$m 1-4: Indium powder [melting point 156.7° C.] of average particle diameter 110 $\mu$m Component (2): Metal Filler 2-1: Aluminum powder of average particle diameter 7.4 $\mu$m 2-2: Zinc oxide powder of average particle diameter 1.0 $\mu$m 2-3: Nickel powder of average particle diameter 10.0 $\mu$m 2-4: Aluminum powder of average particle diameter 120 $\mu$m Flux: gel having rosin has its main constituent The above ingredients were introduced into a planetary mixer to give the composition shown in Table 3 (Examples) and Table 4 (Comparative Examples), and mixed with stirring at 70° C. (below the melting point of Component (1)) for 1 hour. Next, the compound obtained was coated to the same thickness on both surfaces of the above aluminum foil to form a heat-dissipating member of predetermined shape having an overall thickness of 300 $\mu$m.

The surface state when the sheet was formed was evaluated from the arithmetical average roughness (cutoff value: $\lambda c=8$ mm), using a surface roughness gauge (Mitsutoyo Ltd., Model No: Sufect-501).

Next, the aforesaid heat-dissipating member was sandwiched between two standard aluminum plates, and heated at 170° C. for 15 minutes while applying a pressure of approximately 1.80 kg/cm$^2$. After preparing a thermal resistance measurement sample as described above, the thickness was measured for each of the two standard plates, and the effective sheet thickness was measured by subtracting the thickness of the standard aluminum plates from the total thickness. The above measurement was performed using a Micrometer (Mitsutoyo, Model No: M820-25VA). Also, the thermal resistance of the final cured product was measured using a thermal resistance measuring apparatus (Horometrics: Microflash). These measurement results are shown in Table 1.

TABLE 3

Units: wt parts

| | Examples | | | | | |
|---|---|---|---|---|---|---|
| | 7 | 8 | 9 | 10 | 11 | 12 |
| Silicone resin: D25TΦ55DVi20 | 100 | 100 | 100 | 100 | 100 | 100 |
| Thermally-conducting filler | | | | | | |
| 1-1 | 1200 | 0 | 0 | 1300 | 1000 | |
| 1-2 | 0 | 1200 | 0 | 500 | 0 | |
| 1-3 | 0 | 0 | 1200 | 0 | 0 | 1500 |
| 1-4 | 0 | 0 | 0 | 0 | 0 | 0 |
| 2-1 | 400 | 400 | 400 | 0 | | |
| 2-2 | 100 | 100 | 100 | 0 | 200 | |
| 2-3 | 0 | 0 | 0 | 0 | 800 | 500 |
| 2-4 | 0 | 0 | 0 | 0 | 0 | 0 |
| Flux: rosin powder | 0 | 0 | | 0 | 0 | 0 |
| (1)/[(1) + (2)] | 0.706 | 0.706 | 0.706 | 1.0 | 0.5 | 0.75 |
| Surface state when sheet is formed Arithmetical average roughness: Ra(μm) | 2.8 | 3.2 | 2.9 | 3.2 | 3.5 | 3.4 |
| Thermal resistance (mm²·K/W) (including contact resistance) | 12.7 | 13.9 | 16.2 | 12.2 | 16.5 | 16.9 |
| Thickness (μm) (including aluminum foil) | 120 | 160 | 145 | 120 | 135 | 140 |

TABLE 4

Units: wt parts

| | Comparative Examples | | | | |
|---|---|---|---|---|---|
| | 6 | 7 | 8 | 9 | 10 |
| Silicone resin: D25TΦ55DVi20 | 100 | 100 | 100 | 100 | 100 |
| Thermally-conducting filler | | | | | |
| 1-1 | 600 | 0 | 1600 | 0 | 1200 |
| 1-2 | 0 | 0 | 0 | 0 | 0 |
| 1-3 | 0 | 300 | 0 | 0 | 0 |
| 1-4 | 0 | 0 | 0 | 1200 | 0 |
| 2-1 | 200 | 1000 | 1200 | 400 | |
| 2-2 | 100 | 300 | 400 | 0 | 100 |
| 2-3 | 0 | 0 | 0 | 200 | 0 |
| 2-4 | 0 | 0 | 0 | 0 | 400 |
| Flux: rosin powder | 0 | 0 | 1.0 | 0 | 0 |
| (1)/[(1) + (2)] | 0.75 | 0.19 | 0.500 | 0.66 | 0.706 |
| Surface state when sheet is formed Arithmetical average roughness: Ra(μm) | 2.5 | 2.7 | Composition very brittle, falls off aluminum foil | 9.4 | 8.3 |
| Thermal resistance (mm²·K/W) (including contact resistance) | 31.5 | 26.7 | | Difficult to prepare due to scatter in thickness | 28.5 |
| Thickness (μm) (including aluminum foil) | 120 | 130 | | | 220 | a)As the material is non-homogeneous, there was scatter in the thermal resistance even for identical thicknesses.

Example 13

Figure 1:
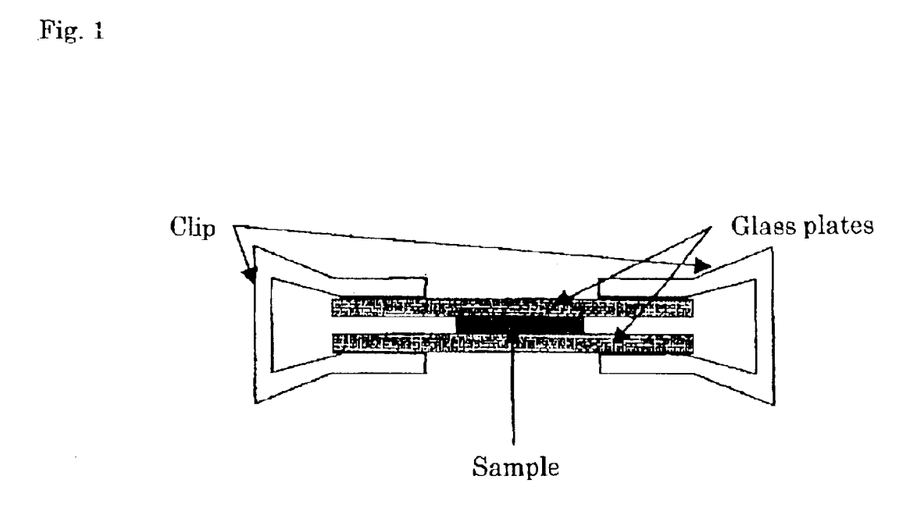
FIG. 1 is a schematic diagram of apparatus for evaluating pumping-out properties.

The heat-dissipating member (thickness 300 μm) obtained in Example 8 was stamped out into a circle of diameter 12.7 mm, and sandwiched between two glass plates (FIG. 1). Next, the following heat shock test was performed while applying a pressure of 1.8 kg/cm² to the heat-dissipating member by sandwiching the above two glass plates with clips, and a pumping-out evaluation was made. The results obtained are shown in Table 5.

Heat Shock Test:

One cycle was (125° C./15 minutes→25° C./10 minutes→50° C./15 minutes→25° C./10 minutes), and 25 cycles were performed.

Figure 2:
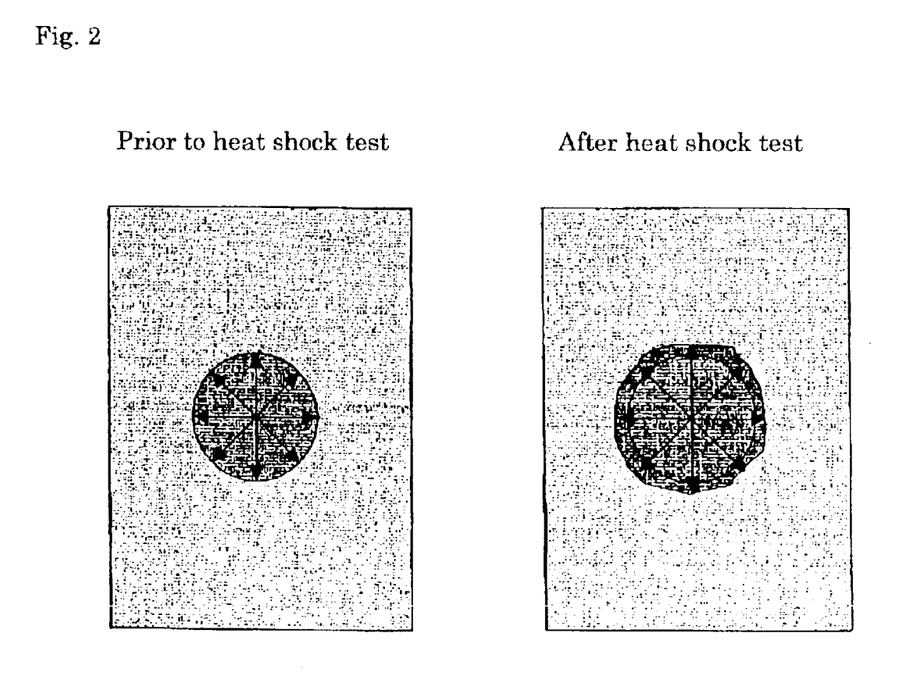
FIG. 2 is a diagram describing a pumping-out ratio.

Pumping-Out Evaluation:

The degree of bleeding from the initial state to the outer circumference was compared as an average of four diametric directions (FIG. 2).

The pumping-out ratio=(length average in four diametric directions after heat shock)/(length average in four initial diametric directions: 12.7 mm)

Comparative Example 11

The pumping-out ratio was calculated in an identical manner to that of Example 13, except that the composition used in Example 8 was formed into a sample sheet (thickness 250 μm) without using aluminum foil. The results are shown in Table 5.

Comparative Example 12

The pumping-out ratio was calculated in an identical manner to that of Example 13, except that a commercial thermally-conducting silicon grease (G746: Shin-Etsu Kogyo Ltd.) was formed into a sample of 50 μm thickness.

The results are shown in Table 5.

TABLE 5

|  | Example 13 | Comparative Example 11 | Comparative Example 13 |
|---|---|---|---|
| Thickness ($\mu$m) | 300 (including aluminum foil) | 250 (without aluminum foil) | Commercial thermally-conducting grease (G746: Shin-Etsu Chemicals) |
| Pumping-out ratio | 1.24 | 1.43 | 1.98 |

What is claimed is:

1. A heat dissipating member installed (at the boundary) between a heat dissipating electronic component which reaches a higher temperature than room temperature due to its operation, and a heat-dissipating component which dissipates the heat produced by said heat dissipating electronic component, wherein said heat-dissipating member is a thermally-conducting silicone resin composition comprising 100 wt parts of a silicone resin and 1,000–3,000 wt parts of a thermally-conducting filler, said member is non-fluid at room temperature prior to the operation of said electronic component, but due to the emission of heat when said electronic component operates, said member loses its viscosity, softens or melts so as to effectively fill the gap between said electronic component and said heat-dissipating component, said thermally-conducting filler comprising a low melting point metal powder (1) having a melting temperature of 40–250° C. and a particle diameter of 0.1–100 $\mu$m, together with a thermally-conducting powder (2) having a melting temperature exceeding 250° C. and an average particle diameter of 0.1–100 $\mu$m, said filler being used such that (1)/[(1)+(2)]=0.2–1.0.

2. The heat-dissipating member according to claim 1, wherein the shape of said heat-dissipating member is that of a sheet or a film.

3. The heat-dissipating member according to claim 1, wherein said heat-dissipating member internally comprises a metal foil and/metal mesh having a thickness of 1–50 $\mu$m and thermal conductivity of 10–50W/mK as an interlayer.

4. The heat-dissipating member according to claim 3, wherein the overall thickness of the heat-dissipating member comprising said interlayer is within the range of 40–500 $\mu$m.

5. The heat-dissipating member according to claim 1, wherein said silicone resin comprises a silicone resin having an $RSiO_{3/2}$ (T unit) and $R_2SiO_{2/2}$ (D unit) in the molecule (where, R is an unsubstituted or substituted monofunctional hydrocarbon group having 1–10 carbon atoms).

6. The heat-dissipating member according to claim 1, wherein said silicone resin comprises a silicone resin having an $RSiO_{3/2}$ (T unit) in the molecule (where, R is an unsubstituted or substituted monofunctional hydrocarbon group having 1–10 carbon atoms), and comprises a silicone oil or silicone natural rubber having a viscosity at 25° C. of 100 Pa/s or more.

7. The heat-dissipating member according to claim 1, wherein said thermally-conducting composition comprises 0.05–40 wt parts of a flux ingredient relative to 100 wt parts of silicone resin.

8. The heat-dissipating member according to claim 1, wherein the thermal conductivity of said thermally-conducting composition is 0.5W/mK or more, and the viscosity at 80° C. is in the range of $1\times10^2$–$1\times10^5$ Pa/s regardless of whether or not the low melting point metal powder is in the molten state.

9. The heat-dissipating member according to claim 2, wherein a flux ingredient is coated on the surface of said heat-dissipating member.

10. The heat-dissipating member according to claim 3, wherein said interlayer is an interlayer coated with flux on the surface, and a flux ingredient is coated on the surface of the thermally-conducting silicone resin composition formed on both sides of said interlayer.

11. The heat-dissipating member according to claim 3, wherein said interlayer is at least one type of metal chosen from among aluminum alloy, magnesium alloy, copper, iron, stainless steel, silver, gold and tungsten.

12. A method of manufacturing a heat-dissipating member, wherein 1,000–3,000 wt parts of a low melting point metal powder (1) having a melting temperature of 40–250° C. and a particle diameter of 0.1–100 $\mu$m, and a thermally-conducting powder (2) having a melting temperature exceeding 250° C. and an average particle diameter of 0.1–100 $\mu$m as a filler wherein (1)/[(1)+(2)]=0.2–1.0, is mixed and kneaded with 100 wt parts of a silicone resin at a temperature below the melting point of said low melting point metal.

13. A method of manufacturing a heat-dissipating member wherein a thermally-conducting composition comprising 100 wt parts of a silicone resin and 1,000–3,000 wt parts of a thermally-conducting filler is coated on both surfaces of an interlayer selected from metal foil and metal mesh, wherein said thermally-conducting filler contains a low melting point metal powder (1) having a melting temperature of 40–250° C. and a particle diameter of 0.1–100 $\mu$m, and a thermally-conducting powder (2) having a melting temperature exceeding 250° C. and an average particle diameter of 0.1–100 $\mu$m, such that (1)/[(1)+(2)]=0.2–1.0, and said thermally-conducting composition is prepared by mixing and kneading the ingredients at a temperature below the melting point of said low melting point metal.

14. A method of installing the heat-dissipating member according to claim 2 between a heat dissipating electronic component and a heat-dissipating component which dissipates the heat produced by said electronic component, wherein, when said sheet is installed, heat above the melting point of said low melting point metal powder (1) is temporarily applied.

15. A method of installing the heat-dissipating member according to claim 3 between a heat dissipating electronic component and a heat-dissipating component which dissipates the heat produced by said electronic component, wherein, when said sheet is installed, heat above the melting point of said low melting point metal powder (1) is temporarily applied.

* * * * *